United States Patent [19]

Thelen

[11] Patent Number: 4,905,004

[45] Date of Patent: Feb. 27, 1990

[54] CYCLE-PORTION ENCODER

[75] Inventor: Robert F. Thelen, Austin, Tex.

[73] Assignee: University of Texas system The Board of Regents, Austin, Tex.

[21] Appl. No.: 179,962

[22] Filed: Apr. 11, 1988

[51] Int. Cl.$^4$ .............................................. G06F 1/04
[52] U.S. Cl. .................................... 341/116; 364/900; 364/200; 124/3
[58] Field of Search ................ 341/111, 116, 63, 117; 364/900, 200

[56] References Cited

U.S. PATENT DOCUMENTS

| 4,063,308 | 12/1977 | Collins et al. | 364/200 |
| 4,231,104 | 10/1980 | St. Clair | 364/900 |
| 4,611,269 | 9/1986 | Suzuki et al. | 341/116 |

OTHER PUBLICATIONS

"A Novel Digital Frequency Multiplier", IEEE Transactions on Instrumentation and Measurement, vol. IM-35, No. 4, pp. 566–570, Dec. 1986.
Technical Specification for Adtech Frequency Scaling Module, Model No. FSM 55, Adtech Analog-Digital Technology, Inc., 140 Main Street, Rochester, N.Y. 14614.
Zowarka, Jr., "Mini-Computer Control of Pulsed Power Generators", Master's Thesis, The University of Texas at Austin, pp. 49–67, Dec. 1980.

Primary Examiner—William M. Shoop, Jr.
Assistant Examiner—Helen Kim
Attorney, Agent, or Firm—Arnold, White & Durkee

[57] ABSTRACT

A cycle-portion encoder, an electronic circuit to dynamically measure the period of a variable electrical input signal and generate an output signal at a preselected time in the next cycle, is provided. The cycle-portion encoder locates a point in time in a recurrent signal's period of interest, based on the real-time measurement of the immediately preceding cycle period and a selected portion of the period of interest. A control output is delivered at the desired phase angle (with respect to the input signal) with a resolution limited only by the counting and gating electronics, and an error primarily related to the repeatability of the input signal from cycle to adjacent cycle.

8 Claims, 6 Drawing Sheets 4,905,004

CYCLE-PORTION ENCODER

Support for the development of the present invention was received under U.S. Army ARDEC & DARPA Contract No. DAAK10-83-C-0126 and AMCCOM in Contract No. DAAA21-86-C0259.

BACKGROUND OF THE INVENTION

This invention relates to devices for precisely timing a control output signal with reference to a cyclical input signal which is coupled to a machine or process having low, or predictable, rate of change from cycle to adjacent cycle.

Devices for controlling rotating machinery often require high performance sensing devices to be attached to the machine being controlled. Direct machine position encoding is impractical in some environments of high mechanical stress or of intense magnetic fields. For example, direct attachment to the machine being controlled may be impractical where access to the rotating shaft is impractical, high rotational velocities limit attachments, or electromagnetic interference affects attached instruments.

It is therefore a general object of the present invention to provide high performance control components away from the severe mechanical and electromagnetic environment of the machine or process to be controlled.

SUMMARY OF THE INVENTION

The present invention is an electronic circuit that dynamically measures the period of a variable electric input signal and generates an output signal at a predetermined position in the next succeeding cycle. In one aspect of the present invention, an input signal of frequency $f_1$, the control reference, provides a once per cycle reference directly related to the machine parameter of interest such as rotor position. A clock signal of much higher frequency $f_2$ advances a counter to measure the period $\tau$ of the control reference $f_1$. The digital value of $\tau$ is converted to an analog value and a fraction or portion $\rho$ thereof, where $0 < \rho < 1$, is derived by a preselected setting on a potentiometer. This analogue value is digitized in an analog to digital converter which yields a setpoint, S.P., where $S.P. = \rho \times \tau$.

In the meantime, a counter has been counting clock pulses in the present cycle of interest. This counter value, the "current count," is compared in a magnitude comparator with the setpoint value, S.P., and when the two compared values coincide (or "current count" exceeds S.P.), a control output signal is generated.

BRIEF DESCRIPTION OF THE DRAWINGS

The above-noted and other aspects of the present invention will become more apparent from a description of the preferred embodiment when read in conjunction with the accompanying drawings.

The drawings illustrate the preferred embodiment of the invention, wherein like members bear like reference numerals and wherein:

FIG. 7B is a timebase enlargement of a portion of FIG. 7A.

DESCRIPTION OF A PREFERRED EMBODIMENT

Figure 1:
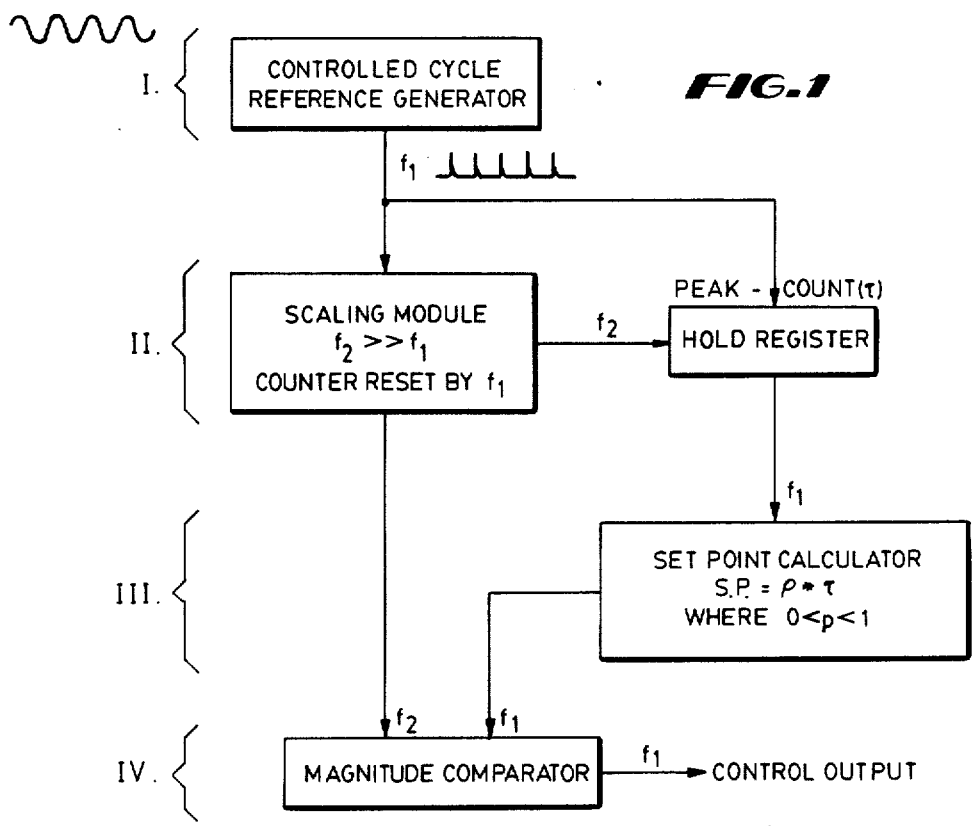
FIG. 1 is a functional block diagram of a cycle-portion encoder of the present invention.

Referring now to FIG. 1, a basic block diagram of the present invention is shown. It is divided into four stages, labeled with Roman numerals I through IV. Roman numeral I represents the Controlled Cycle Reference Generator. This stage takes a low frequency input $f_1$, having one cycle per cycle of the controlled device, and generates a control reference signal, such as a pulse train of narrow width pulses at that same frequency. The time duration (period) between pulses will later be represented by counting clock pulses (the clock having frequency $f_2$) between reference signal pulses. Since reference pulses are used to reset the counter, the pulse width of each reference pulse must be much less than the pulse width of a clock pulse; otherwise, the counter will miss counting a clock pulse. Also, the frequency $f_2$ of the clock must be sufficiently higher than the highest expected frequency of reference signal $f_1$; this determines the minimum resolution of the circuit. For $f_2/f_{1(max.)} = 1000$, the resolution will be greater than 0.1%. The number of bits in the count architecture must be such that $f_2/f_{1(min.)}$ does not exceed the maximum count possible (e.g., 4096 or $2^{12}$ in a 12 bit architecture) during the control periods of interest. This limitation may be overcome by an enhancement discussed later in this application.

Roman numeral II in FIG. 1 represents the scaling module (which includes the clock counter) and the peak-count hold register. When the scaling module receives a reference signal pulse, the value in the counter at that time represents the peak-count value, $\tau$. This value is input into the hold register and then the counter is reset. The counter then begins to count the clock pulses for the next period of the reference signal while the total (peak) count value from the previous cycle is held in the peak count hold register.

Roman numeral III of FIG. 1 represents the setpoint (S.P.) calculator. The set point calculator develops a digital value, based on a replication of the last completed cycle, which will represent a desired portion or fraction $\rho$ of the cycle period. Since this portion of the counts of the last cycle is developed while the counter continues to count clock pulses in the current cycle (the current count), the setpoint calculator should quickly derive the updated setpoint value.

Roman numeral IV in FIG. 1 represents the magnitude comparator. The portion of the previous cycle counts developed by the set point calculator is compared to the current count value which is being incremented at a rate of $f_2$. When the current count value is equal to or greater than the setpoint value (assuming other conditions are met that are explained more fully below), a control output signal is generated.

Figure 4:
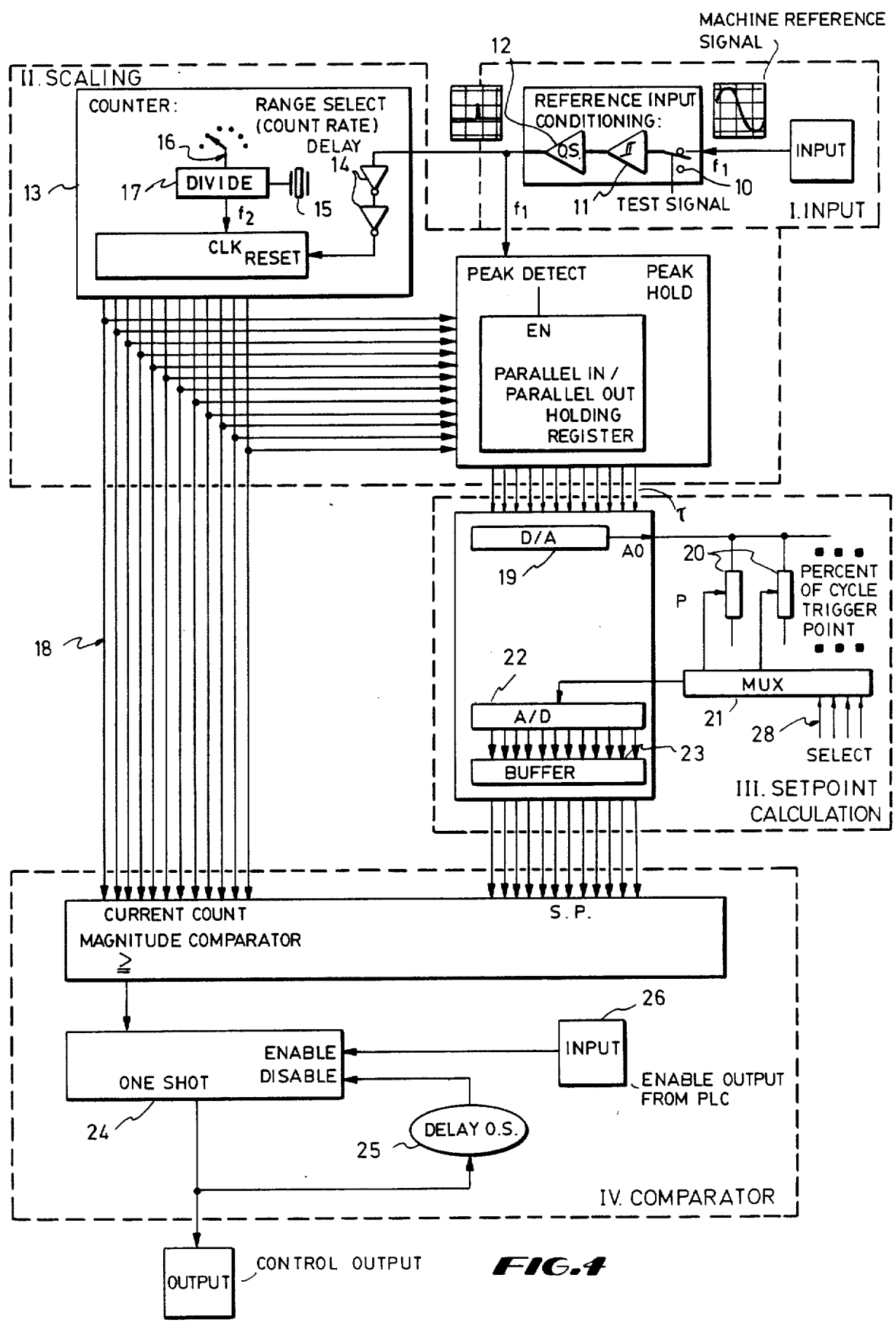
FIG. 4 is a schematic diagram of one embodiment of the cycle-portion encoder.

Referring now to FIG. 4, an embodiment of the present invention is shown. A reference signal, at frequency $f_1$, which represents the rotor position of a machine to be controlled, is provided at the Input. This reference signal is input through switch 10. Switch 10 also provides for a test position in which a simulation frequency may be applied to the circuit. The reference signal is first converted to a train of narrow width pulses in the reference input conditioning circuit. The pulse-width is kept short relative to the clock frequency $f_2$ so that the peak hold buffer may capture the high count and the counter may be reset without missing a count. A comparator 11 followed by a one-shot timer 12 accomplishes the conversion of the input reference signal to a pulse train of like frequency $f_1$ keyed to the positive-going zero-crossing. This pulse train is then input to the scaling module along two paths.

A pulse enables the peak-count hold register, called Peak Hold in FIG. 4. On receiving a pulse, the peak-count hold register (Peak Hold) captures and retains the value in counter 13. The value in counter 13 that is captured will be the number of clock pulses counted in counter 13 since the last reference pulse. The reference pulse, in addition to enabling the Peak-Hold Register, is also input into inverters 14. Inverters 14 delay the reference pulse a few nanoseconds to ensure that the Peak-Hold Register has captured the current value in counter 13 before resetting the counter.

The clock signal may be provided by any appropriate means such as, for example, 1MHz crystal oscillator 15. A manual range select 16 is provided to select a clock signal frequency appropriate to the range of frequencies of the reference signal. This is accomplished in divider 17 to provide a clock frequency of the crystal oscillator frequency or some binary fraction of that frequency. Alternatively, the clock frequency may be dynamically switched during the control period, so long as a full reference cycle is completed after each change before enabling the control output. This is accomplished by replacing the manual range select 16 with an electronic multiplexer. An up/down counter may be used to control the selected channel, and therefore frequency. Gate logic would decrement the counter whenever the clock counter set a carry-bit; and would increment the counter whenever the peak hold register captured a value less than, for instance, 1000. The actuation of either logic path (incrementing or decrementing the clock select counter) would set a flip-flop which would disable the control output until it was reset by another input reference pulse.

When the clock counter 13 is reset, it will begin to count pulses until the incidence of the next reference pulse. At any point in time, then, the current count on clock counter 13 is an indication of how far you are into the current period of the reference signal. This current count is also constantly updating the current count input of the magnitude comparator via bit lines 18. In FIG. 4, twelve bit lines 18 are shown giving 4096 ($2^{12}$) possible clock counts but the number of bit lines may be tailored to a specific application.

Each reference signal pulse causes the Peak-Hold Register to capture the current (peak) value in clock counter 13, which value is the number ($\tau$) of clock pulses counted since the last reference signal pulse. This captured value, $\tau$, is then input to the Set Point Calculator at digital to analog (D/A) converter 19. D/A converter 19 provides an analog value (AO in FIG. 4) proportional to previous cycle peak count, $\tau$. This analog voltage is applied to potentiometers 20, which represent one embodiment of deriving a portion ($\rho$) of peak value, $\tau$. In this embodiment, one potentiometer is provided for each set point desired. Multiplexer 21 (mux or MUX) provides continuity to only one selected potentiometer at a time. Which potentiometer is selected is incremented by select lines 28 as described more fully below.

Multiplexer 21 provides an analog voltage (AI in FIG. 4) which is a selected fraction ($\rho$) of AO. This analog voltage AI is input to analog to digital (A/D) converter 22 which develops the digital value of the set point, S.P. = $\rho * \tau$. As A/D converter develops the updated S.P., it counts up to the new value, so buffer 23 is provided to hold the previous value of S.P. until the updated S.P. calculation is complete. This takes about 25 $\mu$sec; so, for this period of time, the S.P. into the magnitude comparator will actually be the S.P. from the next to last period of the reference signal and not the last one. This is well within design tolerances where a control output signal is called for once every several input periods, for example one output control signal every four input reference signal periods.

Buffer 23 updates the S.P. input to the magnitude comparator. When the current count is equal to or greater than the updated S.P. value, the magnitude comparator provides a pulse to output one shot timer 24. If output one shot 24 is enabled, a control output signal will be generated. Output one shot 24 may be disabled by delay one shot 25. In this way, a control output signal triggers delay one shot 25 which disables output one shot 24 for a set period of time so that successive reference pulses do not generate control output pulses. When delay one shot 25 times out, this disable signal is removed. Output one-shot 24 is also enabled by input from a programmable logic controller (PLC) 26. PLC 26 may provide the operator any number of criteria which must be met before permitting a control output signal.

Figure 3A:
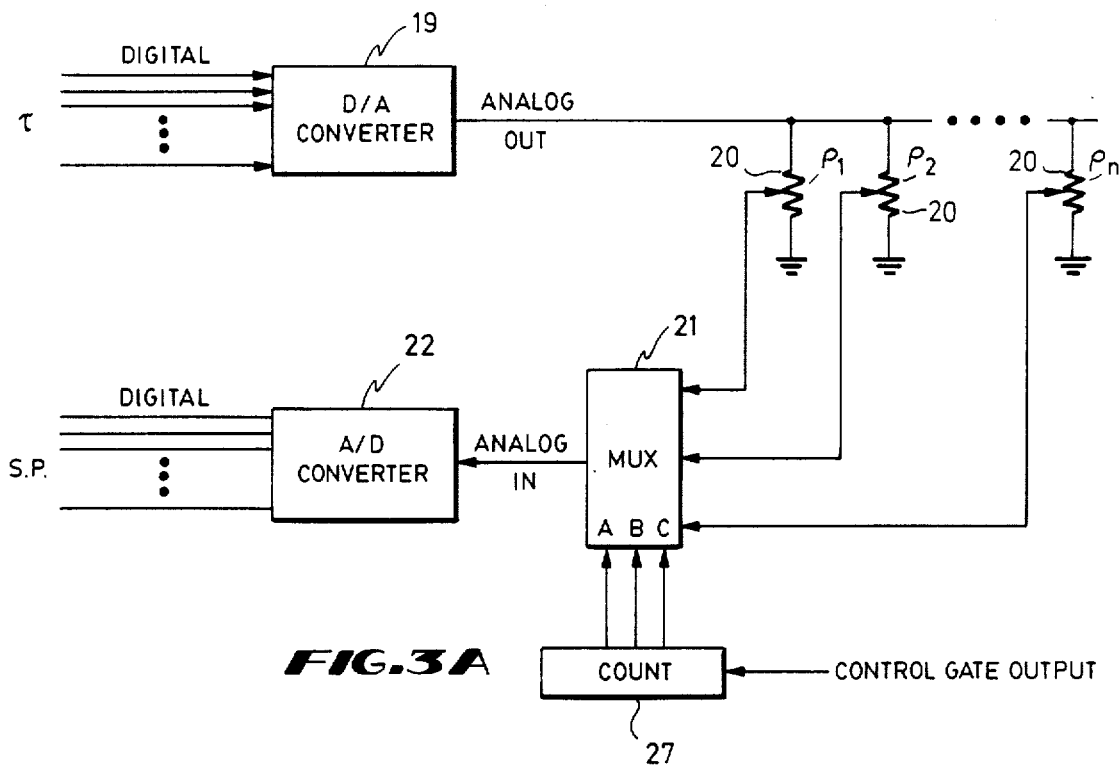
FIG. 3A is a circuit diagram of one embodiment of the setpoint calculation circuit in the cycle-portion encoder.

FIG. 3A is a circuit diagram of a detail of an embodiment of the setpoint calculator. Digital values of $\tau$ are converted to proportional analog values in D/A converter 19. Analog out (AO) signals are sent to n number of potentiometers, one of which is provided with continuity through MUX 21. The choice of potentiometer selected by MUX 21 is incremented by setpoint calculator counter 27. Setpoint calculator counter 27 is incremented by control output signals so that each successive control output signal selects the next preset potentiometer. In this manner, each successive control output signal will be fired at its own preset phase angle.

Figure 3B:
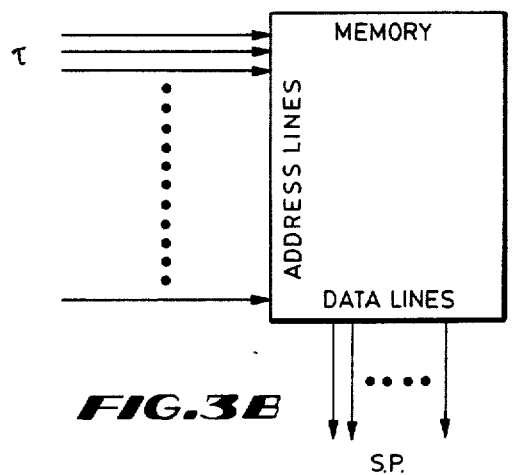
FIG. 3B is an additional embodiment of dynamically deriving setpoint values from values of $\tau$.

FIG. 3B is another embodiment of the present invention. Rather than converting $\tau$ to an analog level, taking a portion thereof and converting that analog portion to digital form, the determination of S.P. can be performed directly by accessing a preloaded memory bank, thus reducing the setpoint calculation to memory access time, on the order of 200 nanoseconds or less. The peak hold register value τ would be applied to the address lines and the memory data lines would deliver a prerecorded value for S.P. corresponding to that τ. The gain in S.P. update speed is offset by the fact that either preset PROM memories must be installed to change the function ρ, or other means must be provided to re-program the memory look-up table.

The memory block in FIG. 3B may be replaced, in yet a third embodiment, by a separate setpoint computer circuit, which takes τ and perhaps other inputs, and calculates by some more advanced algorithm an updated value for S.P.

Figure 5:
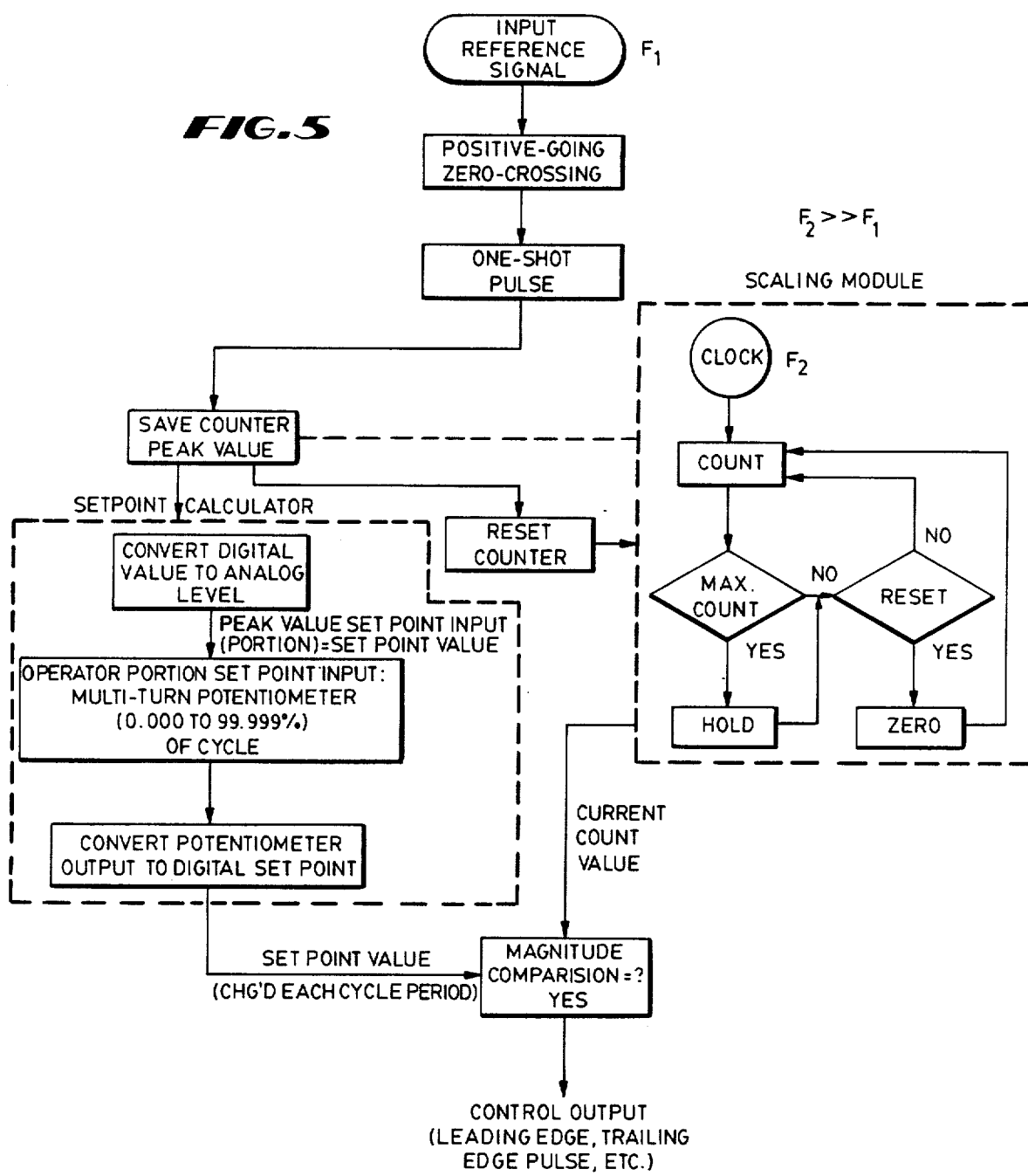
FIG. 5 is a logic diagram showing the functional relationships between the circuit components that generate the output signal in the cycle-portion encoder.

FIG. 5 is a logic diagram of an embodiment of the present invention. The instrument receives an input reference signal $f_1$, which is reliably keyed to a known machine rotor position. The signal positive-going zero-crossing is detected and triggers a one-shot timer to generate a pulse, resulting in a pulse train at frequency $f_1$. This pulse is used to, first, save the value on a high speed counter, and then, to reset the same counter to zero. The counter then continues to accumulate the count at clock frequency $f_2$ until the next save and reset is initiated by the next reference signal pulse.

Within the scaling module, the clock $f_2$ advances the counter. If the maximum count is reached before a reset is received, the counter is simply held at the full count. When the reset is received, the counter is set to zero and the counting is resumed. During the operating period of interest (i.e., when the control output is enabled) the maximum count should never be reached.

The value saved from the counter is passed to the setpoint calculator which first converts the digital value to an analog value. In this embodiment, 0 to 4095 counts is scaled into 0 to 5 volts. This voltage level is applied to the operator input control, which is a multiturn potentiometer. The operator sets the potentiometer to the proportional position which corresponds to the portion of the machine cycle (rotor position) at which he desires to have a control output. The wiper of the potentiometer returns a voltage of the same proportion to the input voltage as the desired cycle portion. Finally, the wiper analog voltage is converted to a digital value for input to a digital magnitude comparator. This conversion is scaled as the inverse of the first conversion (0 to 5 volts into 0 to 4095 counts). The setpoint is thus being finely adjusted at a rate of $f_1$ to accommodate changes in the machine speed.

The magnitude comparator receives input from the setpoint calculator at the rate of $f_1$ and input of the current scaling module count at a rate of $f_2$. When the current count equals or exceeds the setpoint value, the desired cycle portion is arrived at. The comparator output may be subsequently inhibited or conditioned as needed.

Figure 6A:
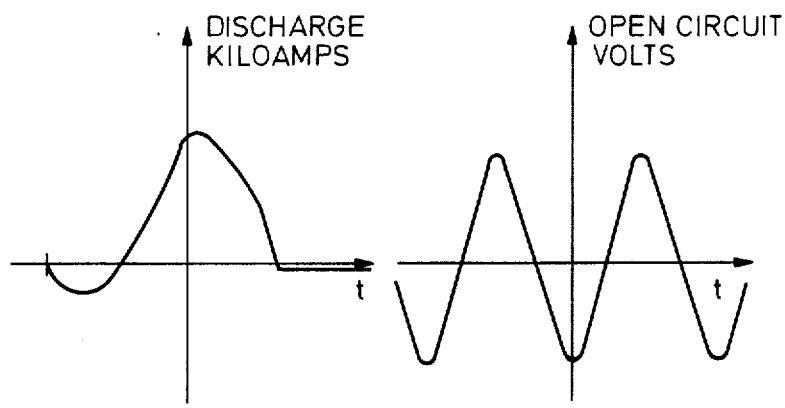
FIG. 6A comprises two time plots that show, first, a typical discharge pulse pair as developed in an application of the cycle-portion encoder and second, a time plot of the open circuit voltage of a machine which utilizes an embodiment of the present invention.
Figure 6B:
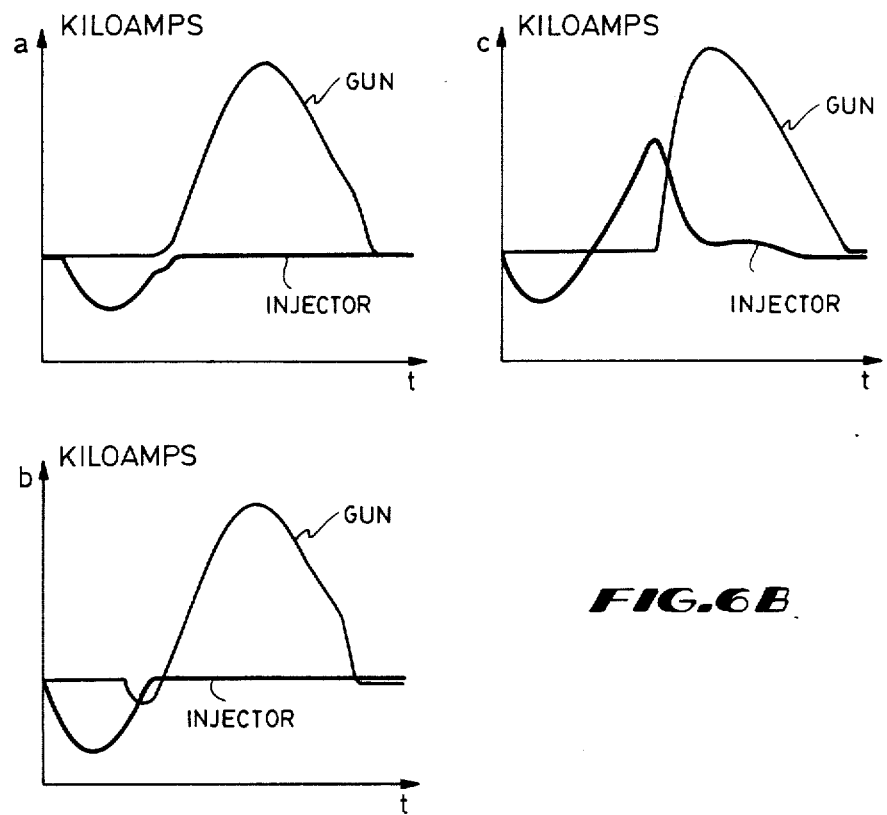
FIG. 6B shows the effect upon the discharge pulse-pair (that is, injector current pulse followed by main railgun current pulse) of control timing being ideal(a), or late(b), or early(c) in the same application of the cycle-portion encoder.

While the present invention is broadly applicable to systems requiring control output signals generated at phase angles based on the behavior of the input reference signal, the Cycle-Portion Encoder of the present invention has been applied to a specific implementation, a compensated pulsed alternator (compulsator) driving an electromagnetic launcher, or railgun. In the system being described, a switched injector railgun is used to drive the projectile into the main gun. In such a system, synchronization of injector and main gun currents determines, to a large extent, efficiency of energy transfer to a projectile. FIG. 6A illustrates a typical injector/main gun discharge pulse pair; along side is a waveform trace of the compulsator open-circuit voltage. FIG. 6B illustrates discharge pulse pairs in their constituent parts.

The strategy of gun firing control is based on a switched injector rail gun of repeatable performance which fires a shorting projectile into a "hot-rail", or directly connected main gun. Using the known operation of the injector gun, a firing angle is determined such that the projectile will move from injector to main gun near a current zero and then be accelerated down the main gun during the follow-on pulse, as shown in FIG. 6B(a). If the projectile leaves the injector early, the main gun utility is wasted as the current alternates polarity, FIG. 6B(b). A late injector gun exit can result in destructive arcing at the injector-main gun interface, and once again the main gun efficiency is compromised, due to delayed current rise and wasted arc energy, FIG. 6(c).

Figure 2:
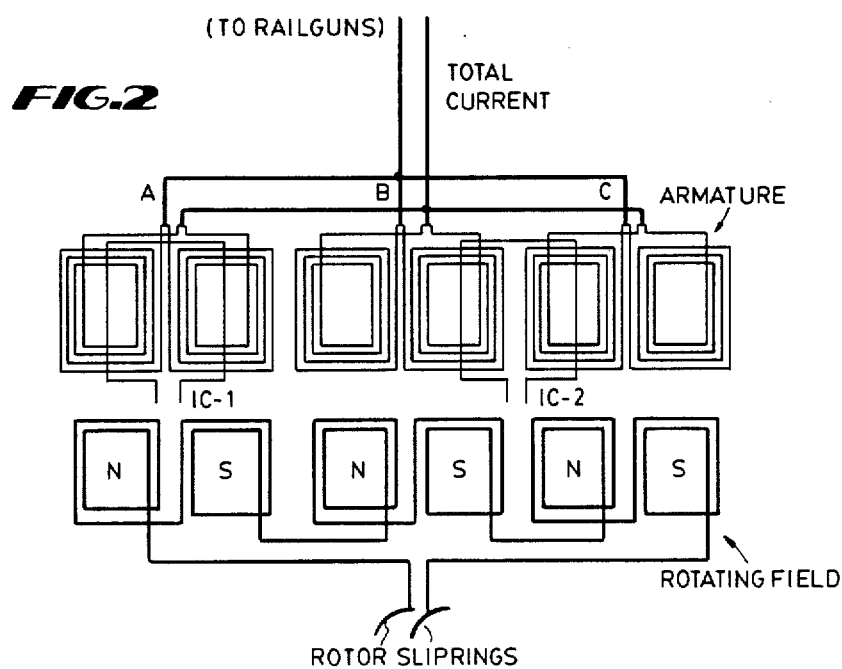
FIG. 2 is a schematic representation of an apparatus for generating the control reference signal, $f_1$, of the present invention.
Figure 7A:
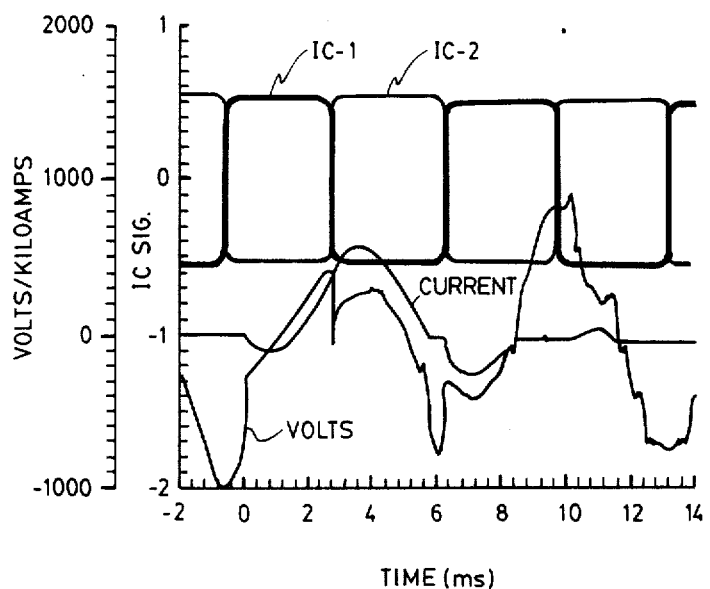
FIGS. 7A and 7B are time plots showing the synchronization of a control reference signal and the result of the generated control output signal at a predetermined time in a subsequent cycle.

The rail gun is powered from a compensated pulsed alternator (compulsator), which incorporates a horizontal shaft, six pole rotating field. The stator armature has, likewise, six poles which are wired as three in-phase circuits and paralleled by buswork external to the machine, as shown in FIG. 2. IC-1 and IC-2 in FIG. 2 represent redundant instrument coils, embedded in the stator, that sense the rotating field, and thus provide a representation of rotor position. IC-1 (or, alternatively, IC-2) provides the input reference signal to the cycle-portion encoder in an embodiment of the present invention. As illustrated in FIG. 7A, this scheme provides a control signal, indicative of rotor position, that is undistorted by rail gun discharge.

Figure 7B:
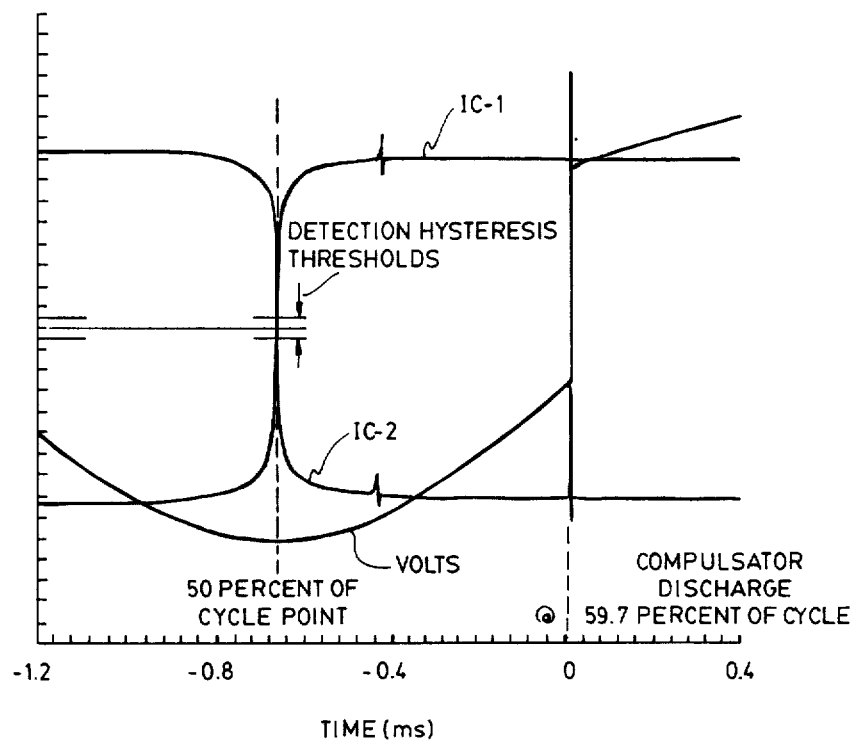

In this application, the control circuit must trigger the switch closing of the injector railgun, based on the phase angle of the armature voltage, or equivalently, the rotor position. Since the compulsator slows at each discharge, the cycle-portion encoder must accommodate changes in firing angle with each shot. FIG. 7B illustrates one such discharge. Using IC-2 sensed voltage as input reference signal, the $f_1$ pulse is initiated by the positive-going zero-crossing of the IC-2 signal, which coincides with the armature open-circuit voltage peak. With the voltage peak defined as the 0% position, the ρ in this plot was set at 59.7% of cycle. As indicated by the change in voltage at time = 0, the initiation of the discharge did indeed occur at the selected phase angle.

The principles, preferred embodiments and modes of operation of the present invention have been described in the foregoing specification. The invention is not to be construed as limited to the particular forms disclosed, since these are regarded as illustrative rather than restrictive. Moreover, variations and changes may be made by those skilled in the art without departing from the spirit of the invention.

What is claimed is:

1. A cycle-portion encoder comprising:
   (a) means for detecting a periodic input signal, keyed to a parameter to be used as a control reference signal, said means for detecting further providing an output pulse train at the reference signal frequency;
   (b) a clock having a frequency greater than the frequency of the output pulse train;
   (c) a counter for counting the number of clock pulses between pulses in the output pulse train, said counter having reset means activated by the pulse train;

(d) memory means for retaining the number of clock pulses counted in the most recently completed period of the pulse train;
(e) means for deriving a portion of the number of clock pulses counted in the most recently completed period of the pulse train; and
(f) means for comparing said portion with the counter value of the current period to enable a control output signal.

2. A control signal generator for generating a control output signal at a predetermined phase angle of a periodic input signal comprising:
   (a) a reference signal generator for receiving the periodic input signal and generating a series of pulses at the frequency of the periodic input signal;
   (b) a counter for developing a digital value representative of the current phase angle of the input signal, the counter being reset by each pulse in the series of pulses;
   (c) a register operable coupled to said counter for holding a digital value representative of the period of the most recently completed input signal cycle;
   (d) a setpoint calculator operably coupled to said register to derive a preselected fraction of the contents of the register, the preselected fraction representing a predetermined phase angle; and
   (e) a comparator operably coupled to the counter and the setpoint calculator such that a control output signal is generated when the counter value equals or exceeds the fraction of the value derived by the setpoint calculator.

3. The control signal generator of claim 2 wherein said setpoint calculator comprises:
   (a) a digital to analog converter for deriving an analog value proportional to the digital contents of the register;
   (b) a potentiometer for selecting a predetermined fraction of the analog value;
   (c) an analog to digital converter for deriving a digital value proportional to the fraction of the analog value.

4. The output signal generator of claim 2 wherein said setpoint calculator comprises:
   (a) a digital to analog converter for deriving an analog value proportional to the digital contents of the register;
   (b) a plurality of potentiometers for selectively deriving a predetermined fraction of the analog value;
   (c) a demultiplexer for providing continuity to a selected one of the potentiometers;
   (d) a counter for incrementing the selection of a potentiometer by the demultiplexer; and
   (e) an analog to digital converter for deriving a digital value proportional to the fraction of the analog value.

5. The control signal generator of claim 2 wherein said setpoint calculator is comprised of a preprogrammed memory containing prescribed setpoint values for each possible register value; said register being applied to the memory address lines and the memory data lines being applied to the means for comparison with the counter value of the current period.

6. The control signal generator of claim 2 wherein said setpoint calculator comprises a digital processor programmed with a predetermined control algorithm.

7. A compulsator discharge control circuit comprising:
   (a) a compulsator, the compulsator having a rotor;
   (b) a sensing means for sensing rotor position, the sensing means generating a periodic waveform that is a function of rotor position;
   (c) a controlled cycle reference generator for receiving the waveform and converting the waveform into a train of reference signal cycles at the same frequency as the waveform;
   (d) a clock having a frequency much greater than the frequency of the reference signal;
   (e) a counter for counting the number of clock pulses between successive reference signal cycles, said counter having reset means reset by the reference signal;
   (f) a register means for capturing the counter contents immediately before the counter is reset;
   (g) a means of deriving a comparison setpoint being a predetermined fraction of the contents of the register;
   (h) a comparator for comparing the contents of the counter to the comparison setpoint; and
   (i) a means to develop a selectively enabled output signal to time the discharges of said compulsator, based on the comparison performed by the comparator.

8. A rail gun firing control circuit comprising:
   (a) a compulsator;
   (b) sensing means for sensing rotation of the compulsator to provide a periodic reference signal;
   (c) a controlled cycle reference generator for receiving the reference signal and converting the reference signal into a train of reference signal cycles at the same frequency;
   (d) a clock having a frequency much greater than the frequency of the reference signal;
   (e) a counter for counting the number of clock pulses between successive reference signal cycles, said counter having reset means reset by the reference signal;
   (f) register means for capturing the counter contents immediately before the counter is reset;
   (g) a plurality of selectable setpoint calculating means for deriving a predetermined fraction of the contents of the register;
   (h) a comparator for comparing the contents of the counter to the fraction of the contents of the register;
   (i) means to develop an output signal to fire a rail gun based on the comparison performed by the comparator; and
   (j) feedback means coupling the output signal to the setpoint calculating means to change the one of the selectable setpoint calculating means that is selected.

* * * * *